United States Patent
Nakai et al.

(10) Patent No.: US 7,221,595 B2
(45) Date of Patent: May 22, 2007

(54) SEMICONDUCTOR DEVICE AND METHOD OF GENERATING SENSE SIGNAL

(75) Inventors: Tsutomu Nakai, Saitama (JP); Takao Akaogi, Cupertino, CA (US); Kazuhide Kurosaki, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 48 days.

(21) Appl. No.: 11/194,007

(22) Filed: Jul. 29, 2005

(65) Prior Publication Data
US 2006/0023539 A1    Feb. 2, 2006

Related U.S. Application Data

(63) Continuation of application No. PCT/JP2004/010915, filed on Jul. 30, 2004.

(51) Int. Cl.
*G11C 11/34* (2006.01)
*G11C 7/00* (2006.01)

(52) U.S. Cl. .................. 365/185.2; 365/203; 365/207; 365/210

(58) Field of Classification Search ............ 365/185.2, 365/207, 208, 210, 203
See application file for complete search history.

(56) References Cited

U.S. PATENT DOCUMENTS

| | | | | |
|---|---|---|---|---|
| 5,163,021 A | | 11/1992 | Mehrotra et al. ............ 385/185 |
| 5,390,147 A | * | 2/1995 | Smarandoiu et al. .. 365/185.21 |
| 5,671,181 A | * | 9/1997 | Hatsuda ................. 365/189.05 |
| 6,044,019 A | | 3/2000 | Cernea et al. ............. 385/185 |
| 6,301,149 B1 | | 10/2001 | Micheloni et al. ........... 365/168 |
| 6,813,189 B2 | * | 11/2004 | Kurihara ................. 365/185.2 |
| 2001/0024381 A1 | | 9/2001 | Ikuo et al. ................. 365/185 |
| 2002/0101775 A1 | | 8/2002 | Nojiri et al. ............... 365/207 |
| 2002/0110021 A1 | | 8/2002 | Kai et al. .................. 365/185 |

FOREIGN PATENT DOCUMENTS

| | | |
|---|---|---|
| JP | 9-171697 | 6/1997 |
| JP | 11-120777 | 4/1999 |
| JP | 2000-251480 | 9/2000 |
| JP | 2001-250391 | 9/2001 |
| JP | 2002-230989 | 8/2002 |
| JP | 2002-237193 | 8/2002 |
| JP | 2000-260192 | 9/2002 |
| WO | WO 90/12400 | 10/1990 |
| WO | WO 00/25318 | 5/2000 |

* cited by examiner

*Primary Examiner*—Son Dinh (57) ABSTRACT

A semiconductor device includes a first cascode circuit having a first current mirror amplifying a reference current flowing through a data line of a reference cell, and a second current mirror generating a first potential from an amplified reference current; and a second cascode circuit having a third current mirror amplifying a core current flowing through a data line of a core cell, and a transistor receiving a gate voltage corresponding to the amplified reference current and generating a second potential based on a difference between an amplified core cell current and the amplified reference current. Since the second potential is generated by the difference between the core cell current and the reference cell current, the second potential swings in the full range of the ground power supply voltage to the ground potential, and the range of the amplitude of the power supply voltage can be efficiently utilized. Sensing is enabled for a fine current margin.

14 Claims, 10 Drawing Sheets

SEMICONDUCTOR DEVICE AND METHOD OF GENERATING SENSE SIGNAL

CROSS REFERENCE TO RELATED APPLICATIONS

This is a continuation of International Application No. PCT/JP2004/010915, filed Jul. 30, 2004.

BACKGROUND OF THE INVENTION

1. Field of the Invention

The present invention relates to a semiconductor device and a method of generating a sense signal, and more particularly, to a semiconductor device with a high-precision cascode connection and a method of generating a sense signal.

2. Description of the Related Art

Semiconductor memories are categorized into a volatile type in which information is lost by power off and a non-volatile type in which information is retained even by power off. The latter type of semiconductor memory is typically a flash memory in which data can be erased on a given-area basis with a reduced rewriting time. A cascode circuit is employed to implement the current-to-voltage conversion in the flash memories.

Figure 1:
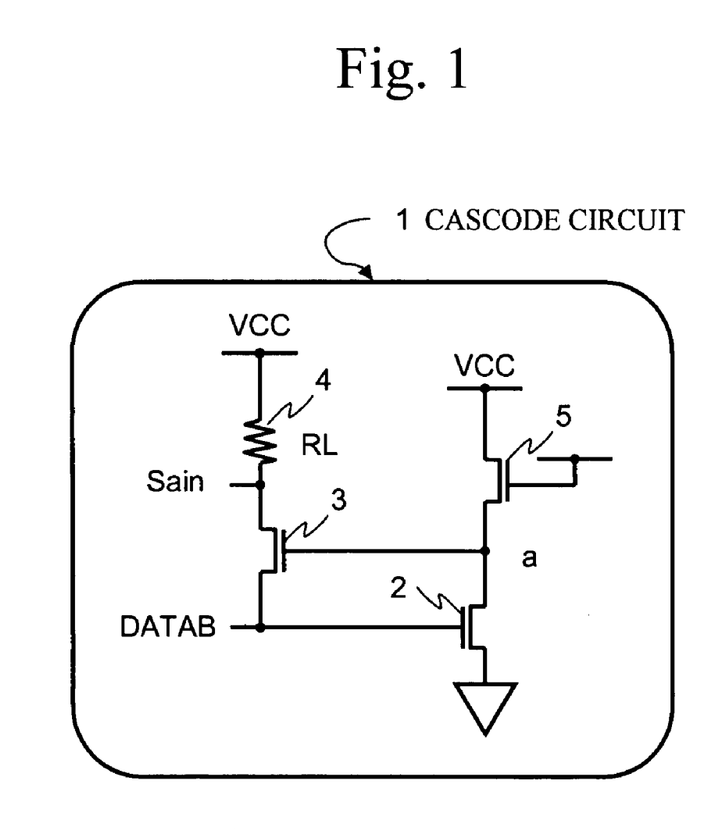
FIG. 1 is a diagram of a conventional cascode circuit.

FIG. 1 is a diagram of a conventional cascode circuit. Referring to FIG. 1, the conventional cascode circuit 1 includes a pair of transistors 2 and 3, a resistor 4 for amplification, and a transistor 5. The paired transistors 2 and 3, which are cascode-connected, and the resistor 4, which is a pull-up cascode element, define a data line voltage DATAB, which is the drain voltage of the cell at the time of read. The cascode circuit 1 generates a sense amplifier input voltage Sain that depends on the current flowing through the cell selected by the selected activated word line.

Figure 2:
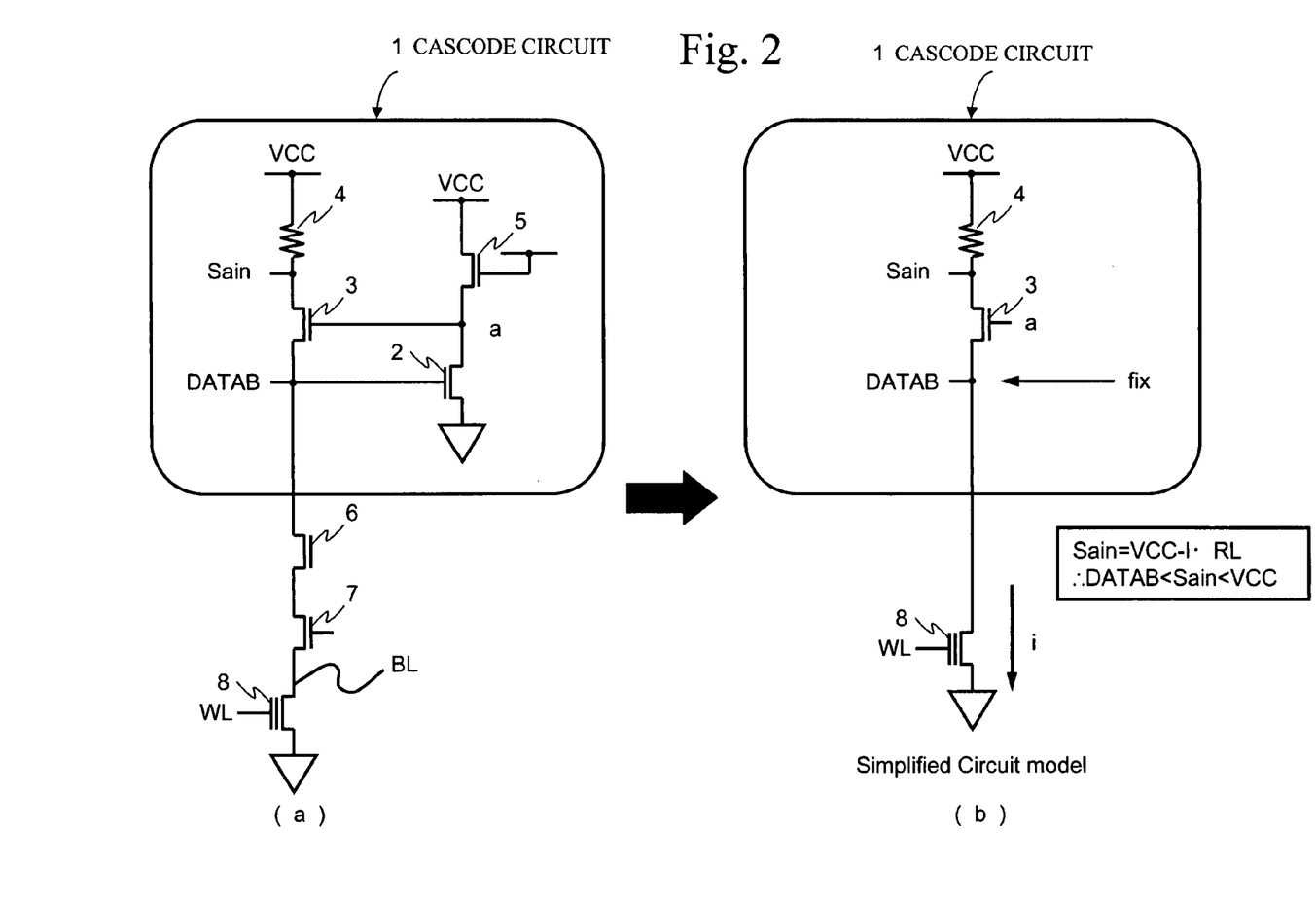
FIG. 2 is a diagram showing the amplitude of a sense amplifier input voltage in the conventional cascode circuit.

FIG. 2 shows amplifying of the sense amplifier input voltage in the conventional cascode circuit. Part (a) of FIG. 2 shows a connection of the cascode circuit shown in FIG. 1 and a memory cell from which data is read, and part (b) thereof is a simplified version of part (a). In FIG. 2(a), reference numerals 6 and 7 indicate transistors, and a reference numeral 8 indicates a memory cell.

In the conventional cascode circuit 2, the sense amplifier input voltage Sain is qualitatively defined by (VCC-I-RL), as shown in FIG. 2. Thus, the amplitude of the sense amplifier input voltage Sain is limited to the range of the data line voltage DATAB to the power supply voltage VCC, namely, (VCC–DATAB). Two means are conceivable for obtaining the sense amplifier input voltage Sain having a large amplitude with the cascode circuit 1. The first means is to raise the power supply voltage VCC, and the second means is to reduce the data line voltage DATAB.

However, the power supply voltage VCC tends to be decreased in terms of reduction in power consumption. Thus, there is a difficulty in raising the power supply voltage VCC. On the other hand, reduction of the data line voltage DATAB certainly increases the amplitude of the sense amplifier input voltage Sain. However, the voltage of the bit line connected to the cell is also reduced. Therefore, there is a limitation on reduction of the data line voltage DATAB within the range in which a sufficiently responsible current is ensured during the sensing period.

A multi-bit cell is employed from requirements for a larger capacity of the non-volatile memory devices. Multi-bit data is stored in the multi-bit core cell, which can store information described by multiple bits. Hence, the cost per bit can be reduced. The multiple levels described by multi-bits are implemented by a reduced current margin, which is the difference between the read current of the core cell and a reference current that flows through a reference cell, as compared to the conventional SLC (Single Level Cell). In the future, the current margin will decrease as the number of multiple levels increases. Although repetitively described, the lower the power supply voltage, the smaller the current margin.

Reference is made to Patent Document 1: Japanese Patent Application Publication No. 9-171697, Patent Document 2: Japanese Patent Application Publication No. 11-120777, and Patent Document 3: Japanese Patent Application Publication No. 2001-250391.

Patent Document 1 describes a method of supplying the reference cell as the gate voltage of the transistor of the core cell. However, the reference voltage is affected by the gate of the core cell transistor and interconnection lines. It is thus difficult to match the reference circuit and the core cell circuit. Patent Document 2 describes a proposal about a comparator circuit used for multi-bit core cells. However, this proposal does not efficiently utilize the amplitude range of the power supply voltage, and is not capable of realizing a circuit operable with a low power supply voltage.

Patent Document 3 shows the reference voltage supplied as the gate voltage of the core cell transistor. However, the reference voltage applied to a differential amplifier and the gate voltage are short-circuited, and is likely to be affected by the gate of the core cell transistor and interconnection lines. This makes it difficult to match the reference side and the core side.

The present invention has an object of solving the above-mentioned problems of the conventional art and providing a semiconductor device with a high-precision cascode circuit capable of easily making a circuit match and operating with a low power supply voltage.

SUMMARY OF THE INVENTION

This object is achieved by a semiconductor device including: a first cascode circuit having a first current mirror amplifying a reference current flowing through a data line of a reference cell, and a second current mirror generating a first potential from an amplified reference current; and a second cascode circuit having a third current mirror amplifying a core current flowing through a data line of a core cell, and a transistor receiving a gate voltage corresponding to the amplified reference current and generating a second potential based on a difference between an amplified core cell current and the amplified reference current.

According to the present invention, the second potential generated by the difference between the core cell current and the reference current makes it possible to handle the voltage that swings in the full range of a power supply potential and the ground potential and to efficiently utilize the amplitude range of the power supply voltage. It is thus possible to improve the effective sensing precision. That is, the sensing is enabled for a fine current margin. Further, the first potential is generated without being affected by the second cascode circuit, and the first and second cascode circuits can easily be matched. The present invention provides the semiconductor device equipped with the high-precision cascode circuits in which the matching between the cascode circuits can easily be made.

The semiconductor device may be configured so that one of the first and second cascode circuits includes a precharge circuit that is provided in a path other than a path including a transistor of one of the first and third current mirrors and precharges the data line. The precharging of the data line quickly causes the data line to be at the stable point and makes it possible to suppress degradation of the sense margin due to current consumed to precharge the data line.

The semiconductor device may be configured so that the precharge circuit precharges, in response to a given signal, the data line during a precharge period that is followed by a sense period or is an initial period of the sense period. With this structure, it is possible to prevent current consumed to charge the data line from flowing through the data line or reduce the current.

The semiconductor device may further include a memory that stores information on the sense period or the precharge period. This makes it possible to rewrite the sense period or precharge period in the memory after packaging and to thus select these periods after packaging.

The semiconductor device may further include a sense amplifier that outputs a signal based on the first potential and the second potential. The magnitude relation of a fine current value for multiple current levels can be identified. In contrast to the prior art, according to the present invention, the first potential (Saref) and the gate voltage (NG) are not short-circuited. Thus, the first potential (Saref), which may be the reference potential, is affected by only the input gate of the sense amplifier circuit. This makes it possible to employ the reference circuit having the same configuration as that of the core circuit and facilitates the matching.

The semiconductor device may further including: a sense amplifier that outputs a signal based on the first potential and the second potential; and a conversion circuit that changes the signal based on the first potential and the second potential to information based on a number of bits that the core cell can store. Thus, IO data can be generated.

The semiconductor device may be configured so that one of the first and second cascode circuits includes a transistor pair that is cascode-connected to the data line. The semiconductor device may be configured so that the core cell has multiple threshold values. The reference voltage based on the current level of the reference cell is produced. It is thus possible to handle reading of multi-bit data required for sensing a fine current margin at different current levels.

The semiconductor device may be configured so that the core cell has a given number of threshold values, and the second cascode circuit has a number of transistors based on the given number of threshold values, each of which transistors generates the second potential. The differences between the core cell current and the reference cell currents can be amplified so that the second potentials used to read the multi-bit data.

The semiconductor device may be configured so that a number of transistors that form the third current mirror is equal to a number of transistors that form the first current mirror. This facilitates to matching between the circuits and quickly drives the gate voltages of the transistors for defining the second potential.

The present invention includes a semiconductor device including: a current mirror amplifying a cell current flowing through a data line of a cell; a generating circuit generating a first potential from the cell current; and a precharge circuit that is provided in a path other than a path including a transistor of the current mirror and precharges the data line. The precharging of the data line quickly causes the data line to be at the stable point and makes it possible to suppress degradation of the sense margin due to current consumed to precharge the data line. The semiconductor device may be a non-volatile semiconductor memory device.

The present invention includes a method of generating signals to be sensed comprising the steps of: generating a first potential by a mirrored current of a reference current flowing through a data line of a reference cell; and generating a second potential by a mirrored current of a core current flowing through a core cell, the mirrored current of the core current being controlled by the mirrored current of the reference current. This makes it possible to handle the voltage that swings in the full range of a power supply potential and the ground potential and to efficiently utilize the amplitude range of the power supply voltage. It is thus possible to improve the effective sensing precision. That is, the sensing is enabled for a fine current margin. Further, the first potential is generated without being affected by the second cascode circuit, and the first and second cascode circuits can easily be matched. The present invention provides the semiconductor device equipped with the high-precision cascode circuits in which the matching between the cascode circuits can easily be made.

The present invention includes a semiconductor device including: a first circuit that generates a first potential by a mirrored current of a reference current flowing through a data line of a reference cell; and a second circuit that generates a second potential by a mirrored current of a core current flowing through a core cell, a mirrored current of the core current being controlled by a mirrored current of the reference current.

According to the present invention, there is provided a semiconductor device with a high-precision cascode circuit capable of easily making a circuit match and operating with a low power supply voltage.

DESCRIPTION OF THE PREFERRED EMBODIMENTS

A description will now be given, with reference to the accompanying drawings, of embodiments of the present invention.

First Embodiment

Figure 3:
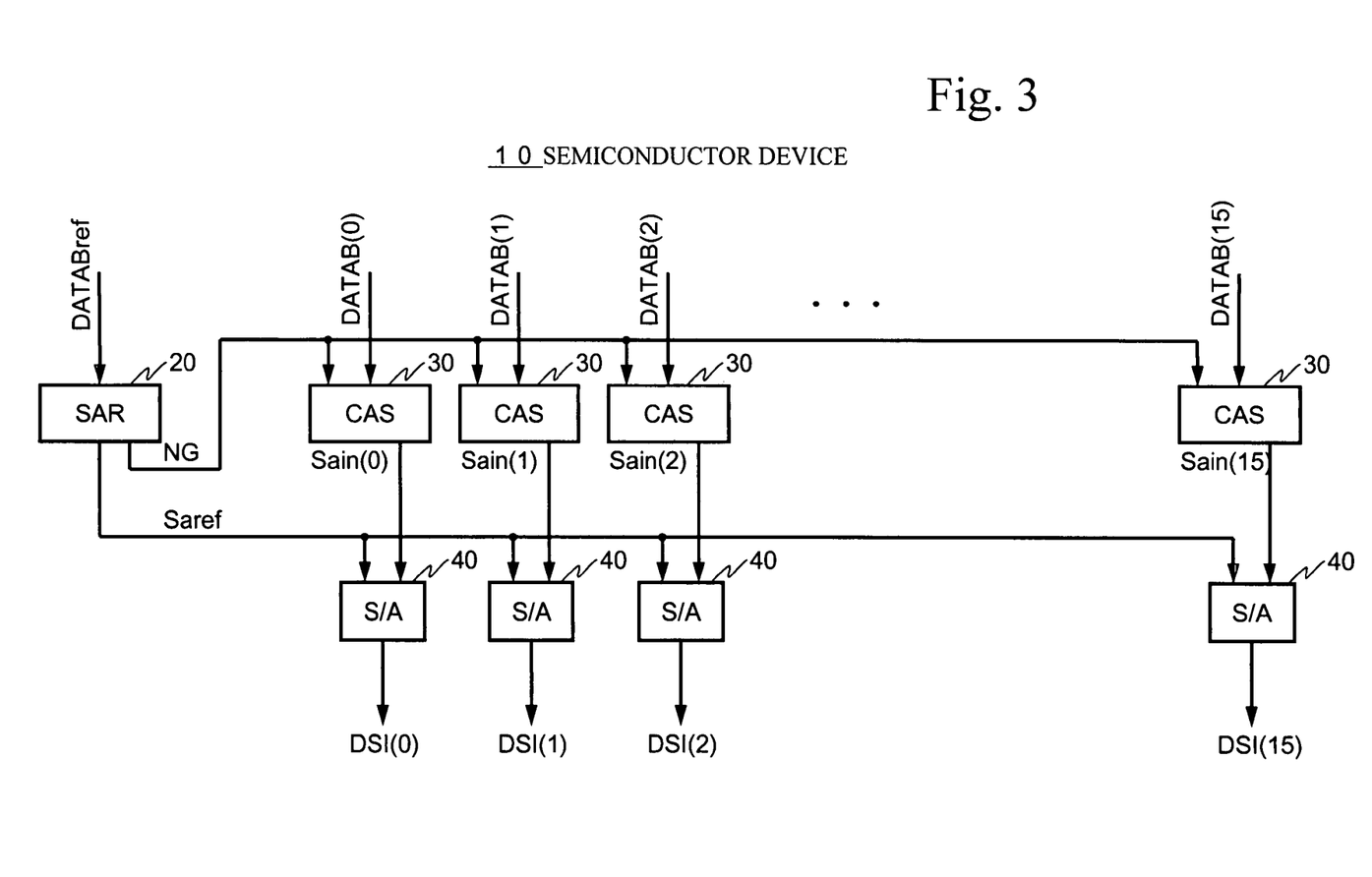
FIG. 3 is a diagram of a semiconductor device according to a first embodiment.

FIG. 3 shows a semiconductor device according to a first embodiment of the present invention. A semiconductor device 10 includes a cascode circuit (SAR) 20 for a reference cell, a plurality of cascode circuits (CAS) 30 for core cells, and a plurality of sense amplifiers (S/A) 40. The semiconductor device 10 may be a semiconductor memory device solely packaged like a flash memory, or may be incorporated into a semiconductor device as a part therein, such as a system LSI.

FIG. 3 shows a circuit configuration for reading an SLC (Single Level Cell). In SLC, cell data is read with the single reference cell. Thus, the cascode circuit 20 for the reference cell is prepared. The reference cell is connected to the drain terminal of the reference cell through a data line DATABref. The cascode circuit 20 for the reference cell generates a reference voltage Saref and an NMOS gate voltage NG.

Further, 16 cascode circuits 30 for core cells are provided and connected, via data lines DATAB(15:0), to the drains of 16 core cells selected by the same word line. The cascode circuits 30 for the core cells receive the NMOS gate voltage NG supplied from the cascode circuit 20 for the reference cell, and generate sense amplifier input voltages Sain(15:0), which are produced by amplifying the differences obtained by subtracting the read currents of the core cells from the read current of the reference cell. The 16 sense amplifier circuits 40 receive the reference voltage Saref and the corresponding sense amplifier input voltages Sain(n) (n=0–15), and output "0" or "1" based on the differences therebetween to DSI(n) (n=0–15).

Figure 4:
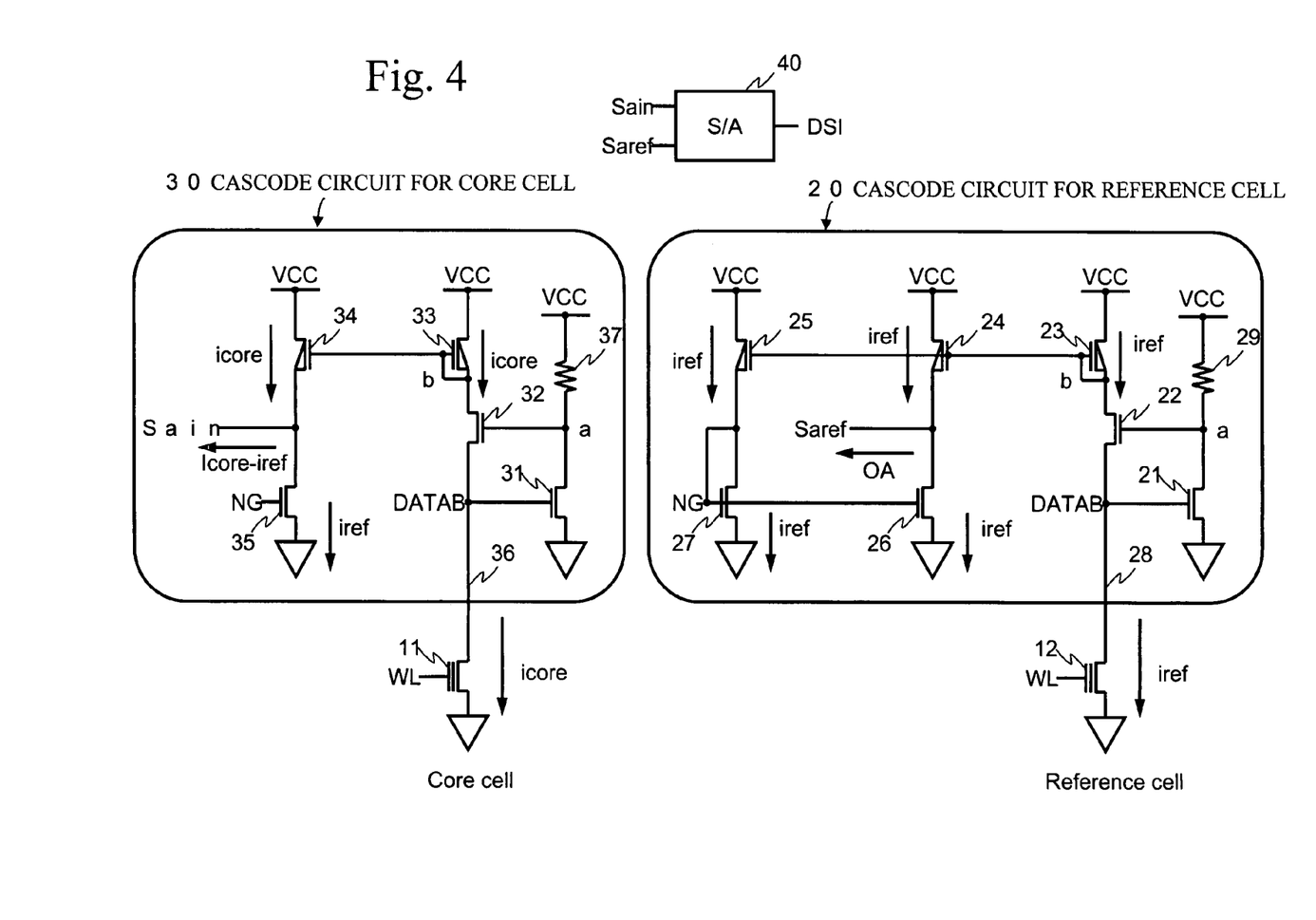
FIG. 4 is a diagram of the outline of a cascode circuit according to the first embodiment.

A detailed description will now be given of each cascode circuit. FIG. 4 is a diagram of the outline of the cascode circuits employed in the first embodiment. There are illustrated the cascode circuit 20 for the reference cell, one cascode circuit 30 for a certain core cell, and one sense amplifier circuit 40. The cascode circuit 20 for the reference cell includes transistors 21 and 22, a PMOS current mirror, an NMOS current mirror, and a resistor 29. The transistors 21 and 22 are cascode-connected to a data line 28 to which the reference cell 12 is connected. The PMOS current mirror is composed of PMOS transistors 23 through 25. The NMOS current mirror generates the reference potential (first potential) Saref from a reference current iref, and is composed of NMOS transistors 26 and 27.

The cascode circuit 20 for the reference supplies the reference current iref amplified by the PMOS current mirror to the NMOS transistor 27 of the NMOS current mirror to thus generate the potential of the node NG, which is supplied, as the gate voltage NG, to the cascode circuit 30 for the core cell. Further, the cascode circuit 20 supplies the amplified reference current iref to the NMOS transistor 26 to thus generate the reference voltage Saref. The potential of the node NG is generated by the transistor 25 separate from the transistor 24 used to generate the reference voltage Saref.

The cascode circuit 30 for the core cell includes transistors 31 and 32, a PMOS current mirror, an NMOS transistor 35 and a resistor 37. The transistors 31 and 32 are cascode-connected to a data line 36 of the core cell 11. The PMOS current mirror is composed of PMOS transistors 33 and 34. The NMOS transistor 35 receives the NMOS gate voltage NG from the cascode circuit 20 for the reference cell. The cascode circuit 30 for the core cell generates a sense amplifier input voltage (second potential) Sain obtained by amplifying the difference between the core cell current Icore and the reference current iref by an NMOS transistor 35 receiving the NMOS gate voltage HG and the PMOS current mirror, which amplifies the core cell current.

It is to be noted that the conventional cascode circuit has the amplitude of the sense amplifier input voltage that is limited to (VCC–DATAB). In contrast, the cascode circuit 30 for the core cell employed in the present embodiment has an arrangement in which a node b is not used as the sense amplifier input voltage but is connected to the gate of the PMOS current mirror. That is, the output stage of the cascode circuit 30 is formed by the PMOS current mirror composed of the transistors 33 and 34. Thus, the cell current icore can be amplified and transmitted as it is.

Figure 5:
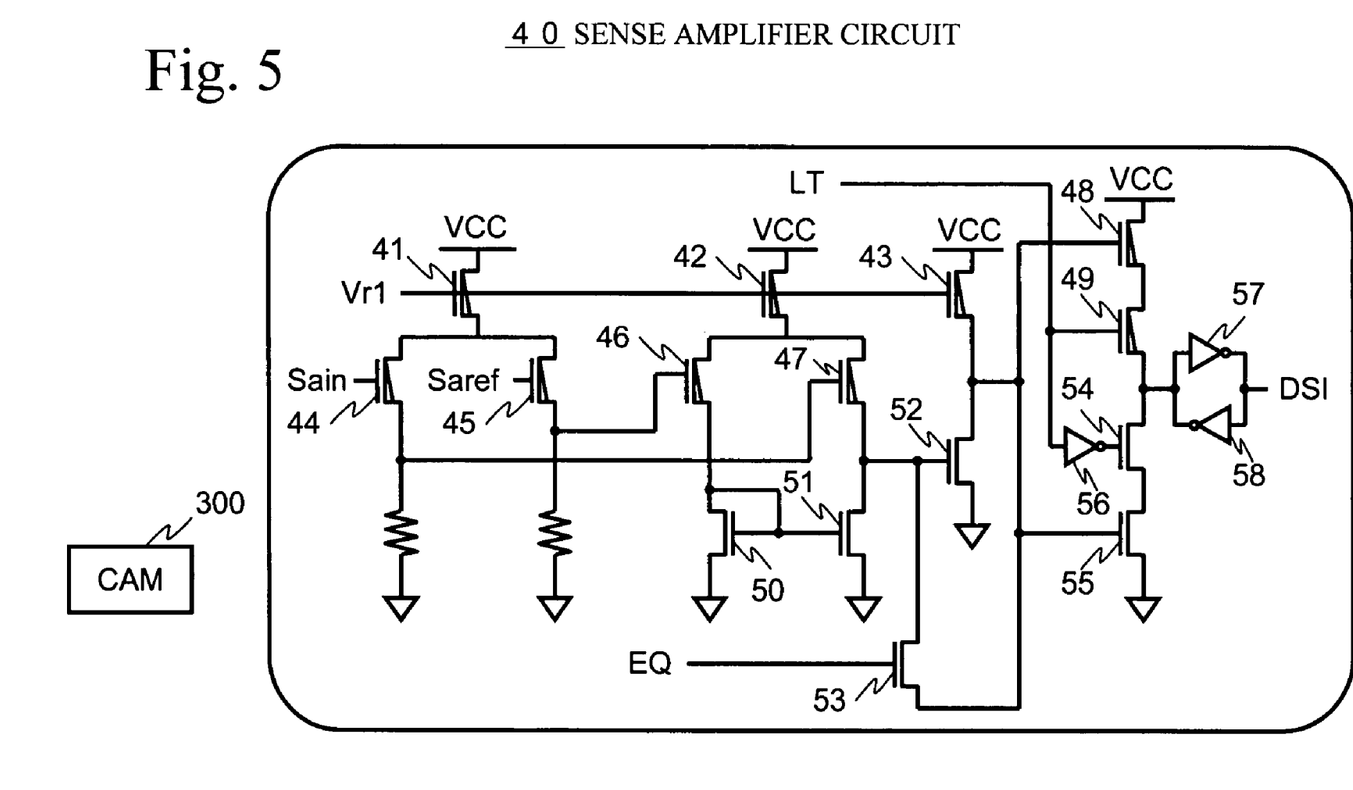
FIG. 5 is a diagram of a sense amplifier circuit.

The sense amplifier 40 will now be described. FIG. 5 shows the sense amplifier 40. Referring to FIG. 5, the sense amplifier 40 includes PMOS transistors 41 through 49, NMOS transistors 50 through 55, and inverters 56 through 58. The sense amplifier 40 has two stages of differential pairs of PMOS transistors for the sense amplifier input potential Sain and the reference potential Saref, and an amplifier stage for amplifying the difference. The gate of the transistor 53 is supplied with a control signal EQ, and an inverter 56 connected to the gate of the PMOS transistor 49 and the gate of the NMOS transistor 54 is supplied with a control signal LT.

A latch of DSI formed by the inverters 57 and 58 latches the result of a decision made on the two input voltages. An analog reference voltage Vr1 is applied to the gates of the PMOS transistors 41 through 43. A reference numeral 300 indicates a CAM (Content Addressable Memory of non-volatile type). Data can be written into or read from the CAM 300 by a control circuit (not shown). The CAM 300 stores information about a clock pulse EQC and the pulse EQ that defines the sense period.

The sense amplifier 40 compares the reference voltage Saref and the sense amplifier input voltage Sain with each other, and outputs DSI of "0" or "1" depending on the comparison result. For instance, the sense amplifier 40 outputs DSI="0" when the sense amplifier input voltage Sain is greater than the reference voltage Saref (Sain>Saref), and outputs DSI="1" when Sain<Saref. When (Icore−Iref)>0, "0" is output. Thus, "0" is output for Icore>Iref, and "1" is output for Icore<Iref. In this manner, it can be confirmed that the comparison of the cell current can be duly performed.

The voltages Sain and Saref are the input voltages of the sense amplifier 40, and the amplified currents are supplied to the input gates of the sense amplifier. Thus, the sense amplifier has the full range of VSS to VCC. That is, the cascode circuit 30 of the present invention does not have the problem of the conventional cascode circuit in which the sense amplifier is supplied with only the limited range of the sense amplifier input voltage of (VCC–DATAB), which is limited by the data line voltage DATAB. Again, it should be noted that the sense amplifier input voltage can be supplied with the full range of (VCC–VSS). In this manner, the sense amplifier input voltage efficiently utilizes the amplitude range of the power supply voltage. It is thus possible to improve the effective precision of sensing. That is, sensing can be made even for a fine current margin. Preferably, the loads driven by the cascode circuits 20 and 30 shown in FIG. 4 via the nodes b are the same as each other. This can be achieved by making the number and size of transistors 23 and 25 in the cascode circuit 20 equal to those of transistors 34 in the cascode circuit 30, so that the circuits 20 and 30 can be matched. Similarly, the number and size of transistors 26 and 27 are made equal to those of transistors 35.

According to the above-mentioned first embodiment, it is possible to read cell data with the low power supply voltage and sensing with the fine current margin in the reading of SLC.

Second Embodiment

Figure 6:
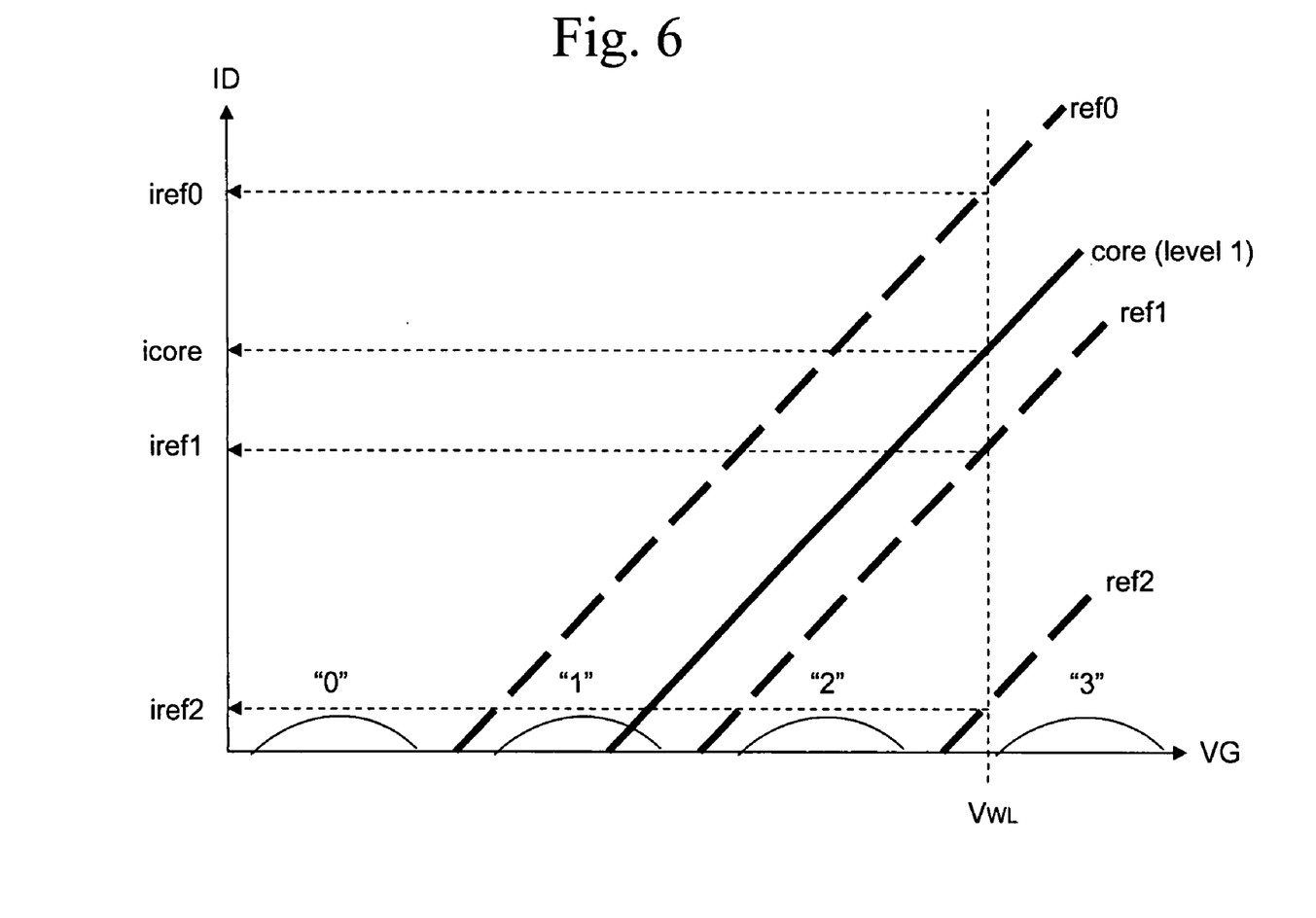
FIG. 6 shows a relationship between the core cell current of MLC and the reference current at the time of reading.

Now, a second embodiment will be described. FIG. 6 shows a relationship between the core cell current and the reference current in reading an MLC (two bits/cell). The MLC is configured so that the memory cell has different threshold values. In FIG. 6, the horizontal axis denotes the gate voltage (threshold value for the distribution of threshold values), and the vertical axis denotes the drain current (the degree of distribution for the distribution of threshold values). The threshold values of the cell define two bits and fall in any of states "0", "1", "2" and "3".

By way of example, a case is considered where a core cell having a threshold value of LEVEL1 is selected and read. A word line WL voltage used at the time of reading is applied to the gate electrodes of three reference cells ref(2:0) and the selected core cell. The word line voltage is set at a level at which little current flows through a core cell having a threshold value of LEVEL3. At that time, the cell currents of the reference cells ref(2:0) and the selected core cells are Iref(2:0) and icore, respectively.

Since the selected core cell has the threshold value LEVEL1, the following relationships stand: icore≦Ierf0, icore≧Iref1, and icore≧Iref2. It is possible to identify in which one of the four states the threshold value of the core cell is by comparing the magnitude of the core cell current with the reference cell currents. In this manner, two-bit information can be obtained from the cell core.

Figure 7:
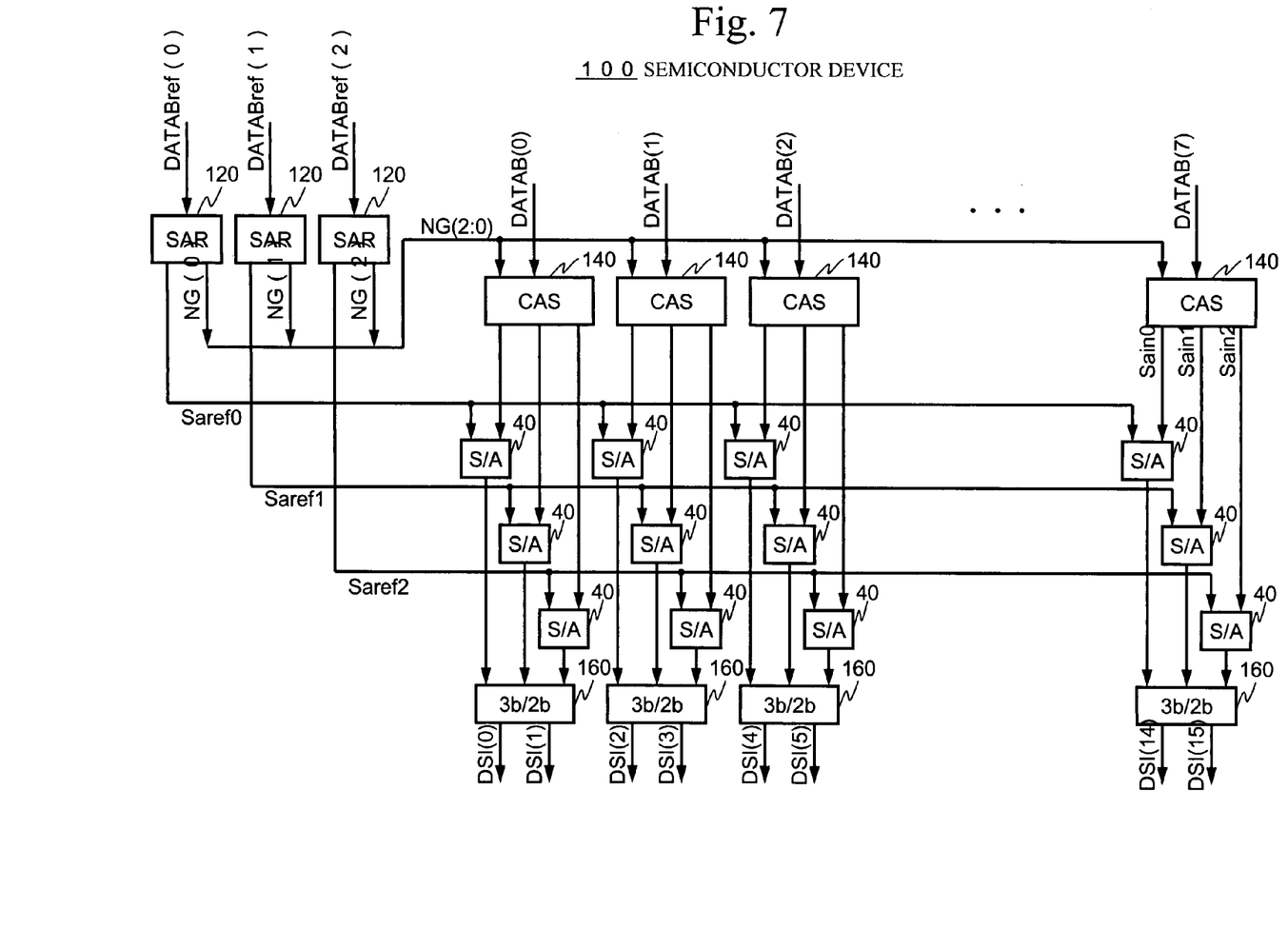
FIG. 7 is a diagram of a semiconductor device according to a second embodiment.

FIG. 7 shows a semiconductor device 100 according to a second embodiment. Referring to FIG. 7, the semiconductor device 100 includes multiple cascode circuits (SAR) 120 for reference cells, multiple cascode circuits (CAS) 140 for core cells, multiple sense amplifiers (S/A) 40, and multiple converters 160. In the first and second embodiments, like reference numerals refer to like elements.

The cascode circuits 120 are connected to the drain terminals of the three reference cells via data lines DATABref(2:0), and generate the reference voltages Saref(2:0) and the NMOS gate voltages NG(2:0). The eight cascode circuits 140 for core cells are connected to the drain terminals of eight simultaneously selectable core cells via data lines DATAB(7:0), and receive the NMOS gate voltages NG(2:0). Each of the eight cascode circuits 140 generates three sense amplifier input voltages Sain(2:0) based on the read current of the corresponding core cell.

The read data consisting of three bits are applied to a 3-bit-to-2-bit converter 160, which converts the three-bit data into two-bit data (two IO bits) based on the state of the core cell. The binary/four-level MLC (Multi Level Cell) has four states. Thus, the three reference cells are compared with the core cell in order to determine in which one of the four states the core cell is.

Figure 8:
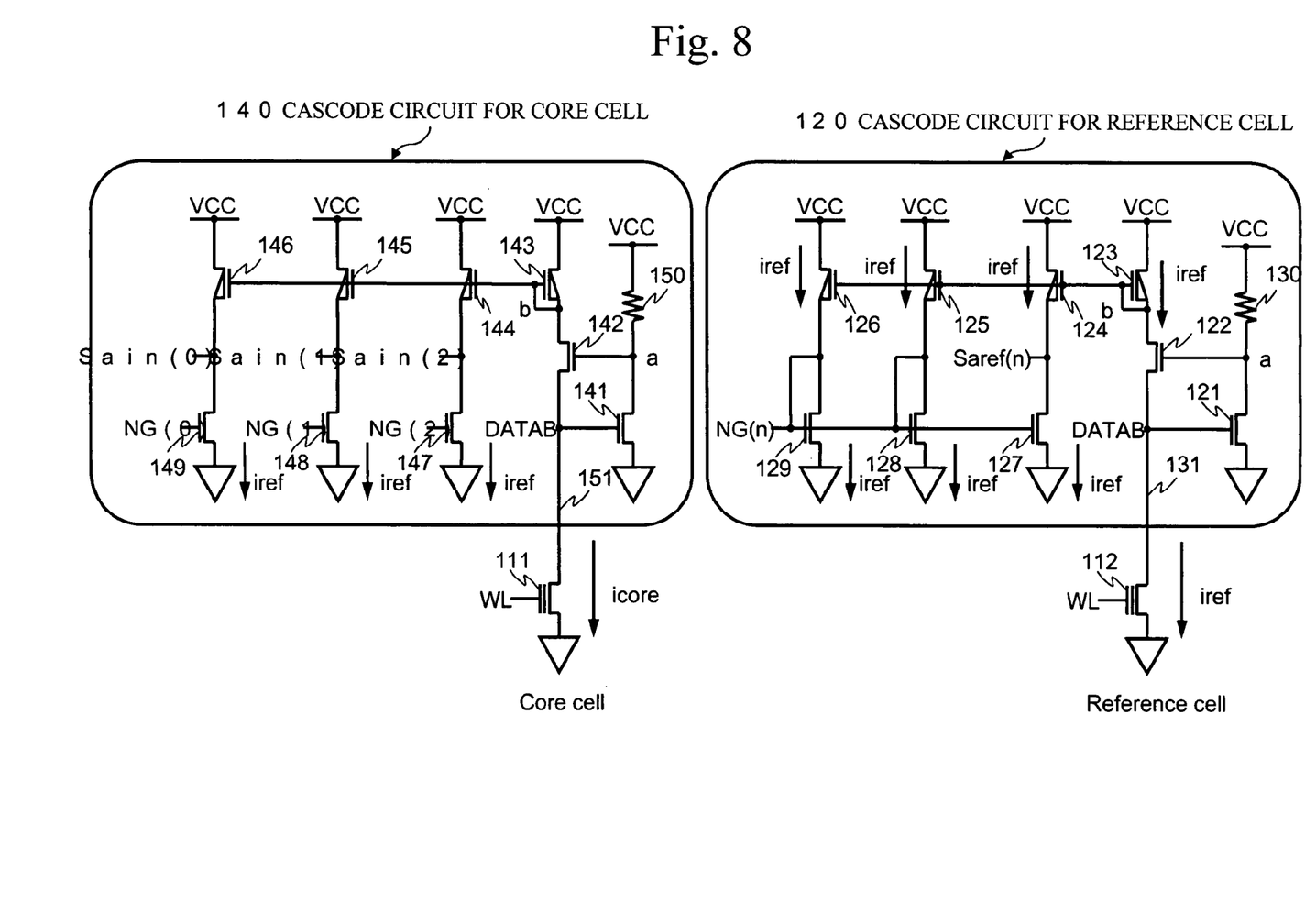
FIG. 8 is a diagram of the outline of a cascode circuit according to the second embodiment.

The cascode circuit employed in the second embodiment will now be described. FIG. 8 schematically shows the cascode circuits used in the second embodiment, in which one cascode circuit 120 for one reference cell and one cascode circuit 140 for one core cell are illustrated.

The cascode circuit 120 for the reference cell includes transistors 121 and 122, a PMOS current mirror, an NMOS current mirror, and a resistor 130. The transistors 121 and 122 are cascode-connected to the data line 131 to which the reference cell 112 is connected. The PMOS current mirror is composed of PMOS transistors 123 through 126. The NMOS current mirror generates the reference potential Saref(n) from the reference current iref, and is composed of NMOS transistors 127 through 129.

The reference current iref amplified by the PMOS current mirror is supplied to the NMOS transistors 128 and 129 of the NMOS current mirror, so that the potential of the node NG(n) can be defined and supplied as the gate voltage NG(n) of any of the NMOS transistors 147 through 149. The amplified reference current iref is supplied to the NMOS transistor 127, so that the reference voltage Saref(n) can be defined. The potential of the node NG(n) is generated by the transistors 125 and 126, which are separate from the transistor 127 for generating the reference voltage Saref(n). Thus, the nodes NG(n) and Saref(n) can be quickly charged separately. The cascode circuit 140 for the core cell includes transistors 141 and 142, a PMOS current mirror, NMOS transistors 147 through 149, and a resistor 150. The transistors 141 and 142 are cascode-connected to a data line 151 to which the core cell 111 is connected. The PMOS current mirror is composed of PMOS transistors 143 through 146. The NMOS transistors 147 through 149 respectively receive the NMOS gate voltages NG(2:0) output by the cascode circuits 120 for the reference cells.

Although the cascode circuits shown in FIG. 8 are principally equivalent to those shown in FIG. 4, there are some differences. First, the cascode circuit 140 for the core cell receives the NMOS gate voltages NG(2:0) from the cascode circuits 120 for the three reference cells. Thus, there are provided three transistors 147 through 149 to generate the voltages Sain, which are compared with the three items of data defined by the three reference cells. The differences between the core cell current and the reference cell currents can be amplified and are supplied as input voltages Sain(2:0) of the three sense amplifiers.

Since the three current mirrors are employed, only one cascode circuit is provided in the cascode circuit 140 for the core cell. The three cascode circuits 120 are provided for the three reference cells.

The cascode circuit 120 for the reference cell employed in the second embodiment differs from the cascode circuit 20 for the reference cell employed in the first embodiment in that the number of the gates of the PMOS transistors 123 through 126 for the current mirror of the cascode circuit 120 viewed from the node b is equal to the number of the gates of the PMOS transistors 143 through 146 for the current mirror of the cascode circuit 140 viewed from the node b. Thus, the load of the reference cell cascode circuit 120 viewed from the node b is close to that of the core cell cascode circuit 140 viewed therefrom, so that the circuits 120 and 140 can be matched easily. Further, the PMOS transistors 143 through 146 for driving the gate voltage NG(n) are as many as twice the number of PMOS transistors used in the first embodiment. This brings about a secondary effect of high-speed driving of the NMOS gate voltage NG(n).

According to the above-mentioned first embodiment, it is possible to read cell data with the low power supply voltage and sensing with the fine current margin in the reading of MLC.

Third Embodiment

The third embodiment of the present invention will now be described. When it takes a long time to charge the data line DATAB, a current for charging the data line flows the PMOS transistors of the PMOS current mirror in addition to the current of the cell selected during the sense period. This reduces the margin for sensing of the cells through which the currents do not flow. The cascode circuit employed in the third embodiment shown in FIG. 9 is designed to avoid the above problem.

Figure 9:
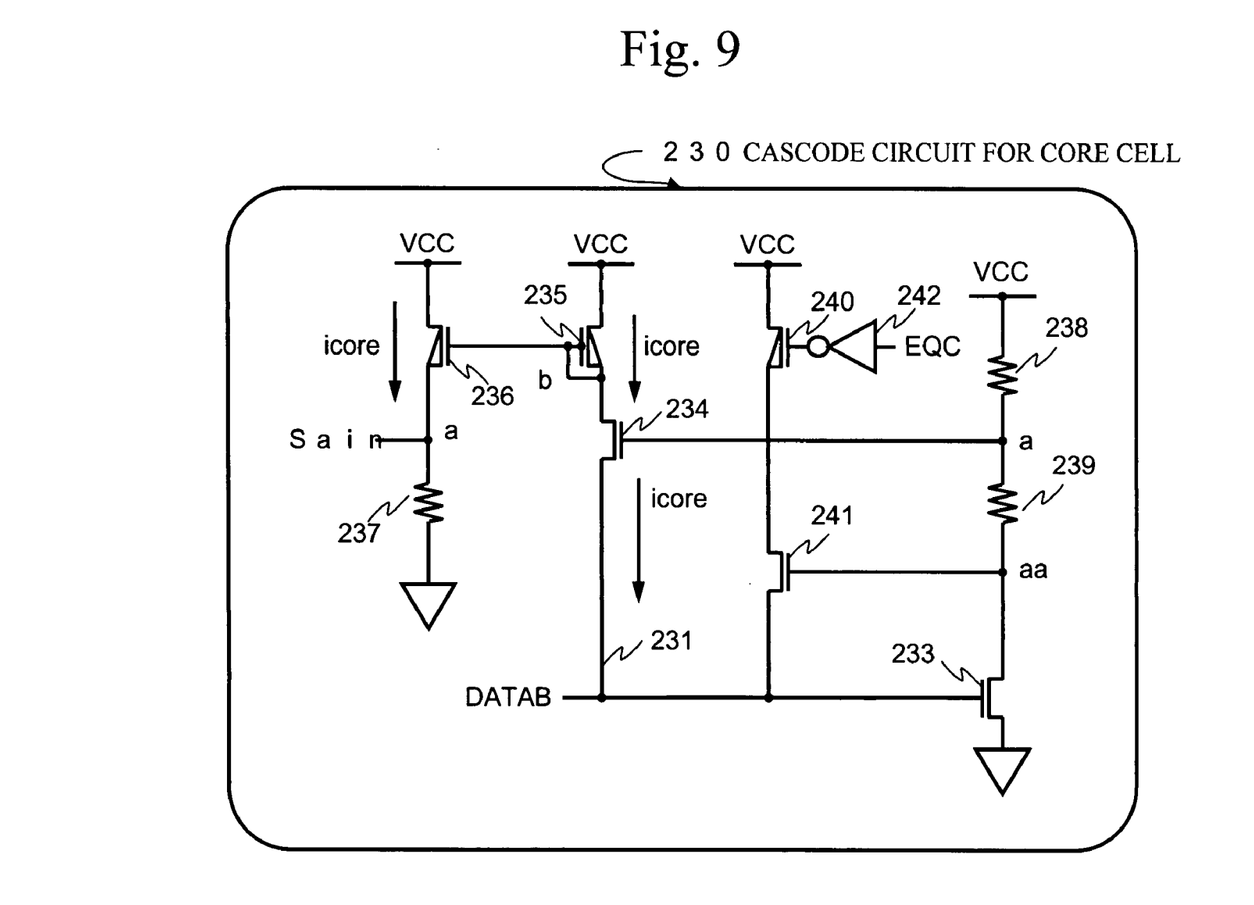
FIG. 9 is a diagram of a cascode circuit for a core cell according to a third embodiment.

FIG. 9 shows the cascode circuit for the core cell employed in the third embodiment. A core cell cascode circuit 230 includes transistors 233 and 234, a PMOS current mirror, resistors 237 through 239, a PMOS transistor 240, an NMOS transistor 241, and an inverter 242. The transistors 233 and 234 are cascode-connected to a data line 231 of the core cell. The PMOS current mirror is composed of PMOS transistors 235 and 236. The PMOS transistor 240, the NMOS transistor 241 and the inverter 242 form a precharge circuit for precharging the data line DATAB. The inverter 242 receives the signal EQC and drives the PMOS transistor 240, which is coupled to the data line DATAB via the NMOS transistor 241. The gate of the NMOS transistor 241 is connected to a node aa between the resistor 239 and the NMOS transistor 233.

The precharge circuit is provided in a path other than the path of the PMOS transistors 235 and 236 of the current mirror, and drives the data line DATAB during a given period (EQC) immediately prior to the sense period (EQ). The clock pulse EQC, which switches to HIGH at the commencement of the sense period or prior thereto, drives the PMOS transistor 240, so that the data line DATAB can be precharged. This makes it possible to prevent current from flowing through the data line DATAB during the sense period or to reduce the current. It is thus possible to suppress degradation of the sense margin caused by the charge current that flows through the data line. This circuit configuration may be applied to the cascode circuit for the reference cell, and to the first and second embodiments.

Figure 10:
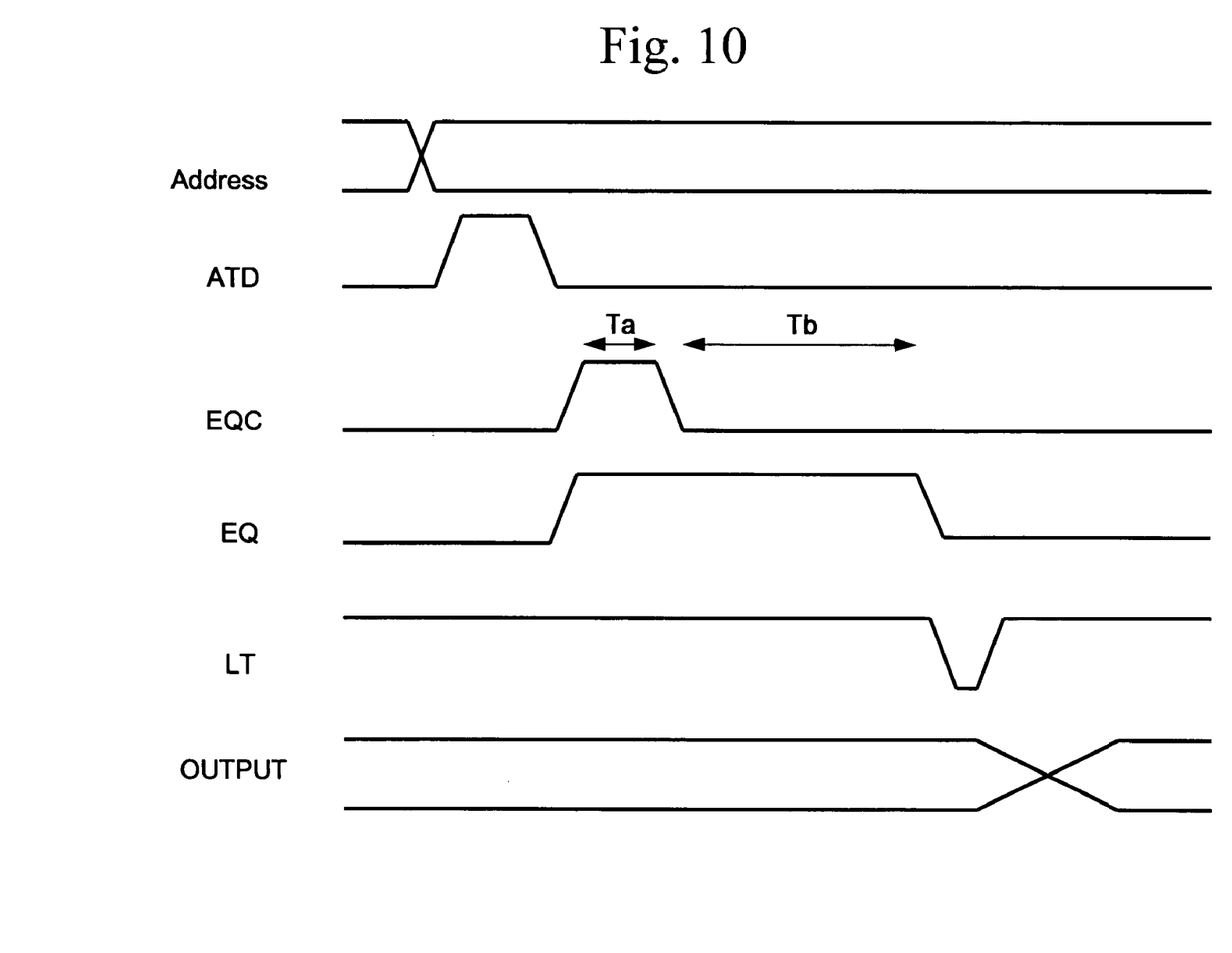
FIG. 10 is a timing chart of a cell data read operation.

FIG. 10 is a timing chart of an operation in which cell data is read. The read operation will now be described by additionally referring to the sense amplifier circuit 40 shown in FIG. 5. The read of cell data starts from a pulse ATD, which is generated by a circuit that detects a change of the address. At the time when the word line voltage is applied to the gate of the selected cell, the pulse ATD switches to LOW and the signals EQ and EQC switch to HIGH. The clock pulse EQC and the pulse EQ that defines the sense period switch to HIGH in the initial period of the sense period or prior to the sense period. When the signal EQC is HIGH, the data line voltages DATAB of the core cell and the reference cell are precharged.

After that, the signal EQ switches to LOW, and the sense amplifier circuit 40 amplifies the result of comparison of the sense amplifier input voltage Saref with the sense amplifier input voltage Sain, and simultaneously the signal LT switches to LOW. The comparison result is latched in a latch composed of the inverters 57 and 58 in synchronism with the rising edge of the signal LT, and read data is thus output.

The optimal clock width and sense period can be selected on the chip bases by trimming, with the CAM 300, the pulse width Ta of the clock pulse EQC and the width Tb from the falling edge of the pulse EQC to the falling edge of he pulse EQ. The CAM 300 stores the width Tb as information about the sense period (EQ), and width Ta as information about the precharge period (EQC) in rewritable fashion.

According to the third embodiment, there are provided the current mirror that amplifies the cell current flowing through the data line connected to the cell, the circuit that generates the first potential based on the cell current, and the precharge circuit that is provided in a path other than the path of the PMOS transistors forming the current mirror and drives the data line DATAB for the given period immediately prior to the sense period. It is thus possible to precharge the data line DATAB and enable high-speed read operation. Further, there is provided the trimming mechanism capable of separately the sense period (EQ) and the precharge period (EQC), so that the optimal precharge period and sense period can be selected on the chip basis after packaging.

The cascode circuit for the reference cell and the cascode circuit for the core cell may be respectively referred to as first and second cascode circuits. The voltages Saref and Sain may be respectively referred to as first and second potentials. The CAM 300 and the converter 160 may be respectively referred to as a memory and a conversion circuit. The clock pulse EQC may be referred to as a given signal.

The present invention is not limited to the specifically described preferred embodiments, but various variations and modifications may be made within the scope of the claimed invention.

The invention claimed is:

1. A semiconductor device comprising:
   a first cascode circuit having a first current mirror amplifying a reference current flowing through a data line of a reference cell, and a second current mirror generating a first potential from an amplified reference current; and
   a second cascode circuit having a third current mirror amplifying a core current flowing through a data line of a core cell, and a transistor receiving a gate voltage corresponding to the amplified reference current and generating a second potential based on a difference between an amplified core cell current and the amplified reference current.

2. The semiconductor device as claimed in claim 1, wherein one of the first and second cascode circuits comprises a precharge circuit that is provided in a path other than a path including a transistor of one of the first and third current mirrors and precharges the data line.

3. The semiconductor device as claimed in claim 2, wherein the precharge circuit precharges, in response to a given signal, the data line during a precharge period that is followed by a sense period or is an initial period of the sense period.

4. The semiconductor device as claimed in claim 3, further comprising a memory that stores information on the sense period or the precharge period.

5. The semiconductor device as claimed in claim 4, further comprising a sense amplifier that outputs a signal based on the first potential and the second potential.

6. The semiconductor device as claimed in claim 4, further comprising:
   a sense amplifier that outputs a signal based on the first potential and the second potential; and
   a conversion circuit that changes the signal based on the first potential and the second potential to information based on a number of bits that the core cell can store.

7. The semiconductor device as claimed in claim 6, wherein one of the first and second cascode circuits includes a transistor pair that is cascode-connected to the data line.

8. The semiconductor device as claimed in claim 7, wherein the core cell has multiple threshold values.

9. The semiconductor device as claimed in claim 7, wherein the core cell has a given number of threshold values, and the second cascode circuit has a number of transistors based on the given number of threshold values, each of which transistors generates the second potential.

10. The semiconductor device as claimed in claim 9, wherein a number of transistors that form the third current mirror is equal to a number of transistors that form the first current mirror.

11. A semiconductor device comprising:
   a current mirror amplifying a cell current flowing through a data line of a cell;
   a generating circuit generating a first potential from the cell current; and
   a precharge circuit that is provided in a path other than a path including a transistor of the current mirror and precharges the data line.

12. The semiconductor device as claimed in claim 11, wherein the semiconductor device is a non-volatile semiconductor memory device.

13. A method of generating signals to be sensed comprising the steps of:
generating a first potential by a mirrored current of a reference current flowing through a data line of a reference cell; and
generating a second potential by a mirrored current of a core current flowing through a core cell, the mirrored current of the core current being controlled by the mirrored current of the reference current.

14. A semiconductor device comprising:
a first circuit that generates a first potential by a mirrored current of a reference current flowing through a data line of a reference cell; and
a second circuit that generates a second potential by a mirrored current of a core current flowing through a core cell, a mirrored current of the core current being controlled by a mirrored current of the reference current.

* * * * *